(12) United States Patent
Clothier et al.

(10) Patent No.: US 7,098,136 B2
(45) Date of Patent: Aug. 29, 2006

(54) STRUCTURE HAVING FLUSH CIRCUIT FEATURES AND METHOD OF MAKING

(75) Inventors: Ronald Clothier, Vestal, NY (US); Jeffrey Alan Knight, Endwell, NY (US); Robert David Sebesta, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/921,839

(22) Filed: Aug. 20, 2004

(65) Prior Publication Data

US 2005/0020079 A1    Jan. 27, 2005

Related U.S. Application Data

(62) Division of application No. 09/863,978, filed on May 23, 2001, now Pat. No. 6,815,709.

(51) Int. Cl.
*H01L 21/302* (2006.01)
*B44C 1/22* (2006.01)
*H05K 1/09* (2006.01)

(52) U.S. Cl. .................. 438/700; 438/745; 438/754

(58) Field of Classification Search ................ 438/692, 438/694, 699, 700, 745, 754
See application file for complete search history.

(56) References Cited

U.S. PATENT DOCUMENTS

| 5,456,817 | A |   | 10/1995 | Hino et al. |   |
|---|---|---|---|---|---|
| 5,457,881 | A |   | 10/1995 | Schmidt |   |
| 5,647,966 | A |   | 7/1997 | Uriu et al. |   |
| 5,664,325 | A | * | 9/1997 | Fukutomi et al. | 29/848 |
| 5,714,050 | A |   | 2/1998 | Akiba et al. |   |
| 5,768,108 | A |   | 6/1998 | Miura et al. |   |
| 5,821,168 | A | * | 10/1998 | Jain | 438/692 |
| 5,822,850 | A |   | 10/1998 | Odaira et al. |   |
| 5,891,513 | A |   | 4/1999 | Dubin et al. |   |
| 5,976,393 | A |   | 11/1999 | Abe |   |
| 5,977,783 | A |   | 11/1999 | Takayama et al. |   |
| 6,165,629 | A | * | 12/2000 | Sachdev et al. | 428/626 |
| 6,190,493 | B1 | * | 2/2001 | Watanabe et al. | 156/300 |
| 6,240,636 | B1 | * | 6/2001 | Asai et al. | 29/852 |
| 6,270,607 | B1 |   | 8/2001 | Tachibana |   |
| 6,270,889 | B1 |   | 8/2001 | Kataoka et al. |   |
| 6,359,235 | B1 |   | 3/2002 | Hayashi |   |
| 6,419,149 | B1 | * | 7/2002 | Yano et al. | 228/235.1 |

FOREIGN PATENT DOCUMENTS

| EP | 0935407 | 8/1999 |
|---|---|---|
| JP | 63-141392 A | 6/1988 |
| JP | 01-159789 A | 6/1990 |
| JP | 07-014628 A | 1/1995 |

OTHER PUBLICATIONS

Merriam-Webster Online Dictionary; http://www.m-w.com/cgi-bin/dictionary.*
Patent Abstract of Japan, Application No. 09068383, Oct. 1998, Sony Corp., Manufacture of Printed Wiring Board.

* cited by examiner

*Primary Examiner*—Shamim Ahmed
*Assistant Examiner*—Binh X. Tran
(74) *Attorney, Agent, or Firm*—Connolly, Bove, Lodge & Hutz, LLP; William H. Steinberg

(57) ABSTRACT

Embedded flush circuitry features are provided by providing a carrier foil having an electrically conductive layer therein and coating the electrically conductive layer with a dielectric material. Circuitry features are formed in the dielectric material and conductive metal is plated to fill the circuitry features.

17 Claims, 10 Drawing Sheets

STRUCTURE HAVING FLUSH CIRCUIT FEATURES AND METHOD OF MAKING

CROSS RELATED APPLICATIONS

This application is a divisional of U.S. patent application Ser. No. 09/863,978, filed May 23, 2001, now U.S. Pat. No. 6,815,709.

FIELD OF THE INVENTION

The present invention relates to providing a protected, high density circuitry structure and method of fabrication.

The present invention provides a fine dimensioned planar circuitry structure and method which results in a smooth, protected high density circuitry pattern. The present invention is especially advantageous for fabricating buried connection levels that are in close proximity to one another in a printed circuit board structure and also advantageous for enabling clear spacer and finer features for gold wire band.

BACKGROUND OF THE INVENTION

Printed circuit boards find a wide variety of uses in the electronics industry with the demand for high performance, printed wiring, or circuit boards for various applications steadily increasing. For instance, the complexity, compactness and electrical performance requirements of printed boards have significantly increased over the last several years.

The demands on printed circuit boards require high density packaging, fine interconnection, multilayer formation and the need to form a plurality of interconnections in a small space.

Currently, printed circuit board interconnection levels are built on top of a dielectric thin film layer. Circuitry features are formed using photolithographic and subtractive etch techniques. In a typical method, a metallic foil and especially copper foil is laminated to the substrate followed by using photolithographic and subtractive etching to create the circuitry. The copper foil includes a roughened or dendrite backside surface for inducing mechanical adhesion to the substrate. Smooth copper layers do not adequately bond without an auxiliary bonding agent.

Great difficulties exist in adequately etching dendrites especially when dealing with small spaces. Moreover, along with the concern created by dendrites, the thickness of the lines (e.g. about 0.5 mils wide), and photolithographic issues (e.g. resolution of fine features, 0.7 mil wire with 1.1 mil space, in a thin photo resist film), and subtractive etch undercut/pad rounding, render clearly and fully resolving small line spaces such as the 1.8 mil pitch features presently desired. Additionally, this subtractive etch approach results in unprotected circuitry features referred to as "skyscrapers" that extend above an underlying plane of dielectric barrier material.

In many structures, it is important to plate another metal such as gold or nickel gold onto the copper circuitry. The "skyscraper" structure causes a problem of bridging or shortening between lines especially where there exist closely spaced fingers due to seed.

SUMMARY OF THE INVENTION

The present invention provides for obtaining a structure having dense embedded flush circuitry features. The present invention makes it possible to create circuitry features that are much more densely configured than those fabricated using current methods. This is made possible since the final structure is a circuitry feature have dielectric regions and conductive features that are coplanar.

In particular, the present invention relates to a structure comprising a carrier foil; an electrically conductive layer on one of the major surfaces of the carrier foil; a dielectric layer located on the electrically conductive layer wherein the dielectric layer has circuitry features; and metal conductive circuitry located within the circuitry features wherein the metal conductive circuitry is flush with and surrounded by the dielectric layer.

The present invention also relates to a multilayer electronic structure and electrical interconnects through it.

The present invention also relates to a method for fabricating a structure having embedded flush circuitry features. The method comprises:
  providing carrier foil having a top side and a bottom side and an electrically conductive layer on the bottom side;
  coating the electrically conductive layer with a dielectric material;
  forming circuitry features in the dielectric material; and
  plating conductive metal to fill the circuitry features.

The present invention also relates to a structure obtained by the above process.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures where the same numeral in different figures refers to the same member.

Figure 1A:
FIGS. 1a–1h are schematic diagrams of the structure in progressive stages of fabrication according to a method of the present invention.

FIG. 1a illustrates a carrier foil 1 typically a copper foil. The carrier foil 1 can include a top smooth metallized surface and a bottom rough or dendrite surface.

The foil is typically 9 to about 72 microns thick and more typically about 12 to about 18 microns thick. Typically, suitable copper foils include 0.5 oz and 1 oz foils.

Figure 1B:
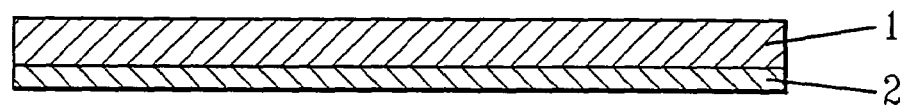

FIG. 1b illustrates blanket coating an electrically conductive layer 2 onto the top smooth metallized surface of carrier foil 1. An example of a suitable electrically conductive layer 2 is chromium which can be deposited by sputtering or evaporation. The layer 2 is typically about 500 to about 5000 angstroms thick and more typically about 800 to about 1500 angstroms thick.

Figure 1C:
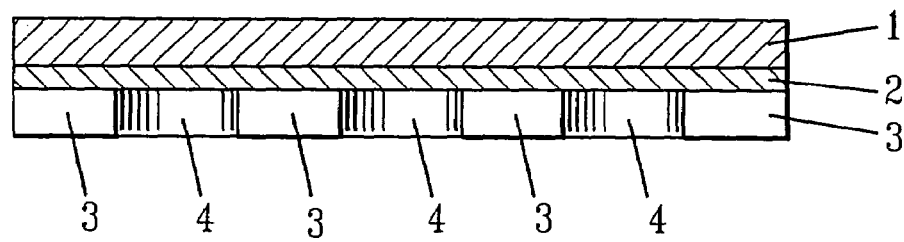

FIG. 1c illustrates coating the electrically conductive layer 2 with a dielectric material 3. The dielectric material 3 can be an inorganic dielectric such as silicon dioxides, silicon nitride and silicon oxynitride or a polymer dielectric material including photoimageable dielectric materials. The dielectric materials 3 is typically about 12 to about 55 microns thick and more typically about 18 to about 37 microns thick.

Examples of suitable photoimageable dielectric materials are polyimides.

The circuit features 4 are then defined in the dielectric material 3 such as by laser ablation. The circuit features are formed through the dielectric 3 up to the conductive layer 2 exposing the layer 2. For example, any of the known techniques for laser ablating can be employed. For instance, in the case of polyimides, the film is subjected to UV radiation of 308 nanometer wavelength. A commercially available source for such is the xenon chloride excimer laser.

The xenon chloride excimer laser as is well known, is designed for pulsed operation and, typically 200 mJ pulses/ $cm^2$ are available at a repetition rate of about 300/second. This laser can be coupled to appropriate beam shaping and homogenizing optics to provide an apparatus for projecting a coherent beam through a mask. In general, intensities above about 60 mJ/$cm^2$ are employed for the laser ablating. Further detail of laser ablating of polyimides can be found for example, in U.S. Pat. No. 4,568,632, disclosure of which is incorporated herein by reference.

The circuit features are typically separated about 0.5 to 3.0 mils. Some circuit features may be as large as 1 inch length by 1 inch width to allow an electronic component such as a silicon chip to reside in the structure. The top surface and circuit features can then be blanket seeded (not shown) by depositing a relatively thin seed layer of a conductive metal. Typical metals include copper and chromium with copper being preferred. The seed layer is typically about 0.2 to about 2.5 micrograms per square centimeters. The seed layer can be deposited by electroless plating.

Figure 1D:
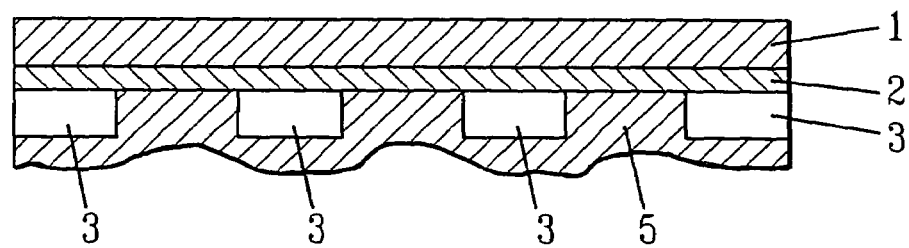

A conductive material such as copper is then blanket plated onto the seed layer (see FIG. 1d). The conductive film can be deposited by electroless plating, electroplating, sputter coating or evaporation techniques that are well known in the art. The preferred method of depositing the conductive film is by electroless plating.

Figure 1E:
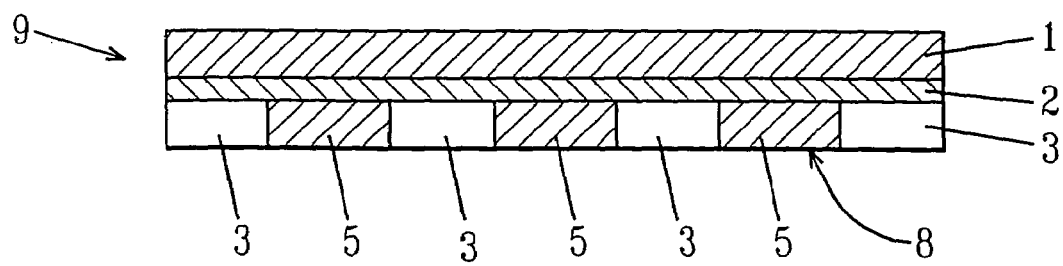

The plated conductive material 5 is then planarized such as employing chemical mechanical polishing to achieve an alternating metal/dielectric high density circuitry structure 9 having a first flush planar circuitry surface 8 (see FIG. 1e).

Figure 1F:
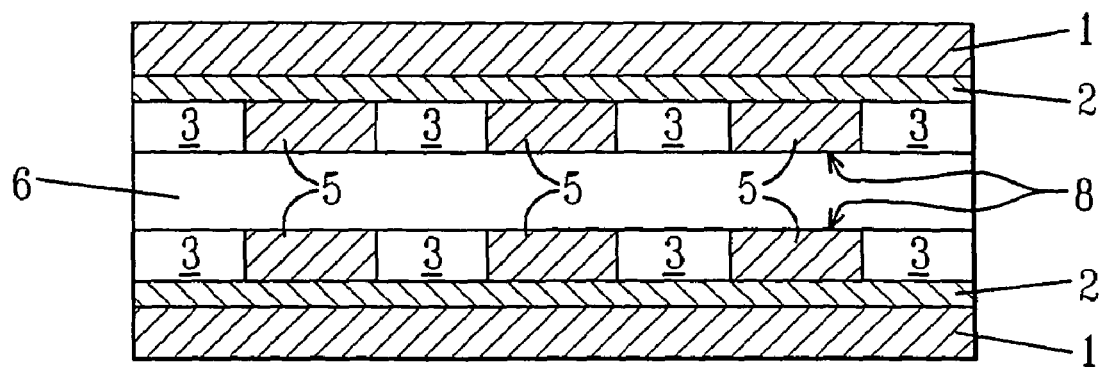

The structure 9 can be employed in single layer of a multi-layer structure by attaching the flush planar circuitry surface 8 to a stiffening dielectric layer 6 such as pre-preg by lamination or by coating with a film or aqueous resist such as a photo imageable dielectric (PID). Pre-pregs are typically dielectric polymeric materials such as epoxides or polyimides reinforced with woven or non-woven fibers such as fiberglass. The use of PID for layer 6 allows interconnects to subsequent layers of metalization thru either standard photo chemical, laser or mechanical techniques such as drilling. In addition, the use of PID for layer 6 allows it to be machined thru laser or photo chemical techniques to contain features for the next layer for flush circuitry. Layer 6 also provided mechanical robustness needed for the following processing. See FIG. 1f for an example of a multi-layer structure.

Figure 1G:
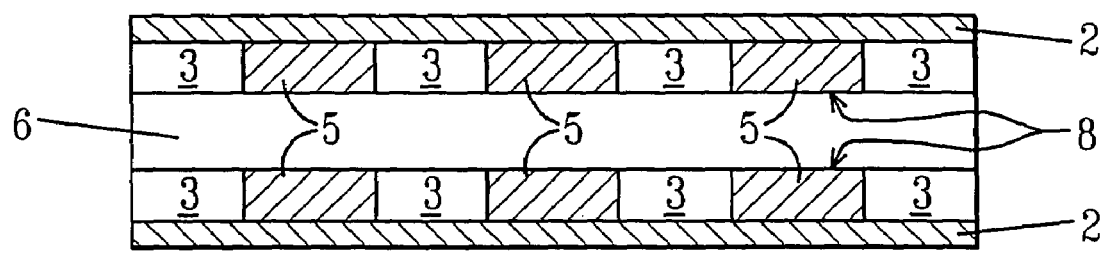

Next the carrier foil 1 can be removed such as by etching in a suitable etchant (see FIG. 1g). The layer 2 such as the chromium acts as an etch mask to protect the underlying conductive material 5 during the removal of carrier foil 1. The layer 2 is a different material than foil 1 and conductive material 5.

Figure 1H:
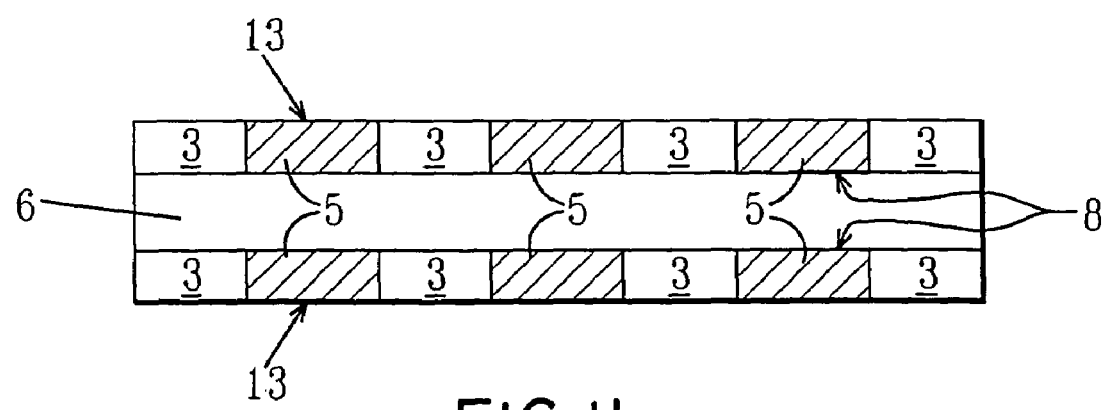

As illustrated in FIG. 1h, the conductive material 2 can be removed since it is no longer required. It can be removed by etching in a suitable etchant.

The two second flush planar circuitry surfaces 13 now revealed are ideal for subsequent metalization of the circuit lines and features. For example, the planar surface the circuitry is flushly embedded in, allows these circuit lines and features to be gold/nickel-gold plated by standard techniques as well know in the art to even finer features and spacing without the traditional bridging problems. Gold deposition may be done selectively and with different types of gold such as hard or soft to enable optimization of both connectors and gold wire bond. Moreover, the multiple structure obtained pursuant to the above processing can then be joined together to form a multilayer circuit board.

Figure 2A:
FIGS. 2a–2h are schematic diagrams of the structure in progressive stages of fabrication according to an alternative method of the present invention.

FIG. 2a illustrates a carrier foil 1 typically a copper foil. The carrier foil 1 can include a top smooth metallized surface and a bottom rough or dendrite surface. The foil is typically about 9 to about 140 microns thick and more typically about 12 to about 18 microns thick. Typically suitable copper foils include 0.5 oz and 1 oz. for typical electronic circuits. In cases where the foil will also serve the purpose of a stiffener such as for chip attach the typical foil will be about 10 oz.

Figure 2B:
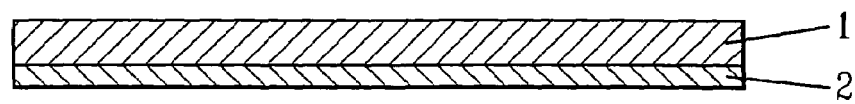

FIG. 2b illustrates blanket coating an electrically conductive layer 2 onto the top smooth metallized surface of carrier foil 1. An example of a suitable electrically conductive layer 2 is chromium which can be deposited by sputtering or evaporation. The layer 2 is typically about 500 to about 5000 angstroms thick and more typically about 800 to about 1500 angstroms thick.

Figure 2C:
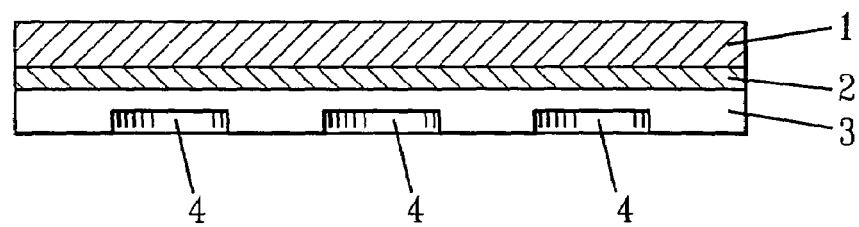

FIG. 2c illustrates coating the electrically conductive layer 2 with a dielectric material 3. The dielectric material 3 can be an inorganic dielectric such as silicon dioxide, silicon nitride and silicon oxynitride or a polymer dielectric material including photoimageable dielectric materials. The dielectric material 3 is typically about 12 to about 105 microns thick and more typically about 18 to about 55 microns thick when circuit features 4 and defined by laser. The dielectric material 3 is typically about 250 microns to about 750 microns thick and more typically about 400 to 600 microns thick when circuit features 4 are formed by embossing. It is also possible to form features in the dielectric layer 3 with a mix of both laser and embossing as long as the thickness is sufficient (250 microns minimum) to support the embossing.

Examples of suitable photoimageable dielectric material are polyimides. The circuit features 4 are then defined in the dielectric material 3 such as by laser ablation or embossing. The circuit features formed in the dielectric layer 3 are not deep enough to expose layer 2. For example, any of the known techniques for laser ablating can be employed. For instance, in the case of polyimides, the film is subjected to UV radiation of 308 nanometer wavelength. A commercially available source for such is the xenon chloride excimer laser.

The xenon chloride excimer laser as is well known, is designed for pulsed operation and, typically 200 mJ pulses/cm$^2$ are available at a repetition rate of about 30/second. This laser can be coupled to appropriate beam shaping and homogenizing optics to provide an apparatus for projecting a coherent beam through a mask. In general, intensities above about 60 mJ/cm$^2$ are employed for the laser ablating. Further details of laser ablating of polyimides can be found for example, in U.S. Pat. No. 4,568,632, disclosure of which is incorporated herein by reference.

The circuit features are typically separated about 0.5 to 3.0 mils. Some circuit features may be as large as 1 inch length by 1 inch width to allow an electronic component such as a silicon chip to reside in the structure.

The top surface and circuit features can then be seeded (not shown) by depositing a relatively thin seed layer of a conductive metal. Typical metals include copper and chromium with copper being preferred. The seed layer is typically about 0.2 to about 2.5 micrograms per square centimeter. The seed layer can be deposited by electroless plating.

Figure 2D:
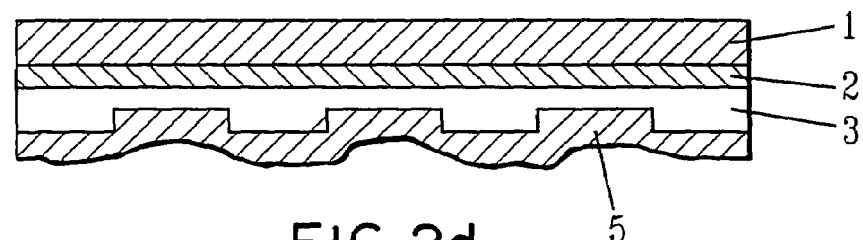

A conductive material 5 such as copper is then blanket plated onto the seed layer (see FIG. 2d). The conductive film can be deposited by electroless plating, electroplating, sputter coating or evaporation techniques that are well known in the art. The preferred method of depositing the conductive film is by electroless plating.

Figure 2E:
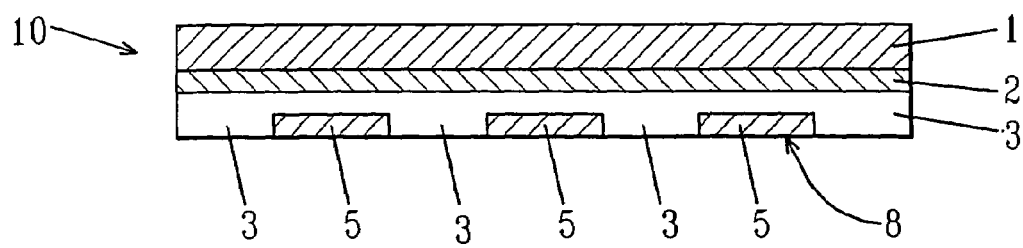

The plated conductive material 5 is then planarized such as employing chemical mechanical polishing to achieve an alternating metal/dielectric high density circuitry structure 10 having flush planar circuitry surface 8 (see FIG. 2e). If ISØP is the final structure sought (FIG. 2e) the flush planar surface 8 is ideal for subsequent metalization of the circuit lines and features. For example, the planar surface the circuitry is flushly embedded in, allows these circuit lines and features to be gold/nickel-gold plated by standard techniques as well as known in the art to even finer features and spacing without the traditional bridging problems. Gold deposition may be done selectively and with different types of gold such as hard or soft to enable optimization of both connectors and gold wire bond.

Figure 2F:
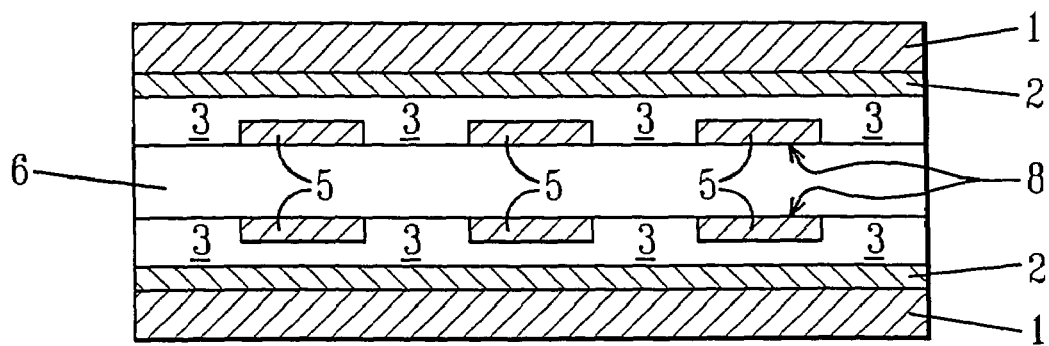

The structure 10 can be employed in single layer or a multi-layer structure by attaching the flush planar circuitry surface 8 to a stiffening dielectric layer 6 such as pre-preg by lamination or by coating with a film or aqueous resist such as a photoimageable dielectric (PID). Pre-pregs are typically dielectric polymeric materials such as epoxides or polyimides reinforced with woven or non-woven fibers such as fiberglass. The use of PID for layer 6 allows interconnects to subsequent layers of metalization thru either standard photo chemical, laser or mechanical techniques such as drilling. In addition the use of PID for layer 6 allows it to be machined thru laser or photo chemical techniques to contain features for the next layer of flush circuitry. Layer 6 also provided mechanical robustness needed for the following processing. See FIG. 2f for an example of a multilayer structure.

Figure 2G:
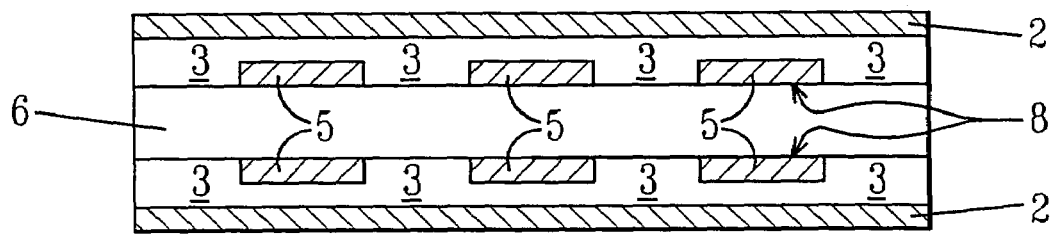

Next, the carrier foil 1 can be removed such as by etching in a suitable etchant (see FIG. 2g). The layer 2 such as the chromium acts as an etch mask to protect the underlying conductive material 5 during the removal of carrier foil 1. The layer 2 is a different material than foil 1 and conductive material 5.

Figure 2H:
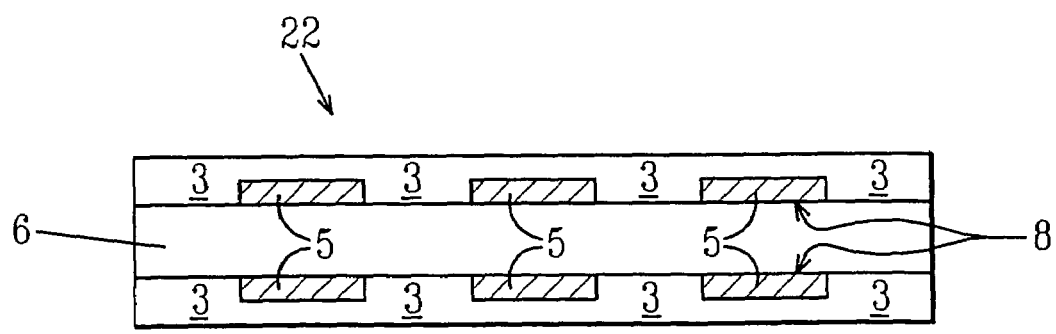

As illustrated in FIG. 2h, the conductive material 2 can be removed since it is no longer required. It can be removed by etching in a suitable etchant. This results in a fully dielectric encapsulated two layer circuit structure 22. Electrical interconnects can now be made thru dielectric layers 3 to conductive circuit features 5 by standard photo chemical, laser or mechanical drilling. In addition dielectric layers 3 can have features formed in it to contain the next layer of conductive circuitry.

Moreover, the multiple structure obtained pursuant to the above processing can then be joined together to form a multilayer circuit board.

Figure 3A:
FIGS. 3a–3h are schematic diagrams of the structure in progressive stages of fabrication according to another method of the present invention.

FIG. 3a illustrates a carrier foil. The carrier foil 1 can include a top smooth metallized surface and a bottom rough or dendrite surface. The foil is typically 9 to about 72 microns thick and more typically about 12 to about 18 microns thick. Typically suitable copper foils include 0.5 oz and 1 oz.

Figure 3B:
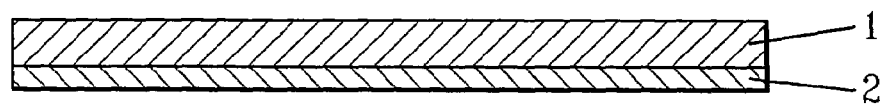

FIG. 3b illustrates blanket coating an electrically conductive layer 2 onto the top smooth metallized surface of carrier foil 1. An example of a suitable electrically conductive layer 2 is chromium which can be deposited by sputtering or evaporation. The layer 2 is typically about 500 to about 5000 angstroms thick and more typically about 800 to about 1500 angstroms thick.

Figure 3C:
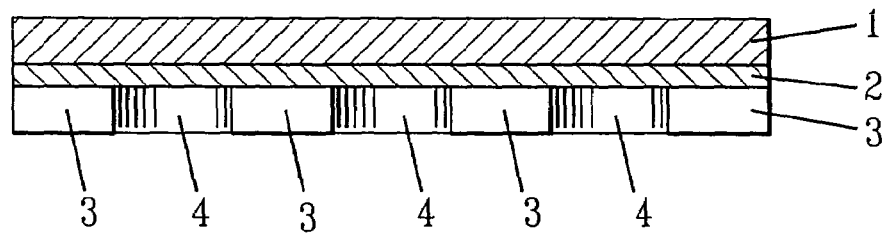

FIG. 3c illustrates coating the electrically conductive layer 2 with a dielectric material 3. The dielectric material 3 can be an inorganic dielectric such as silicon dioxide, silicon nitride and silicon oxynitride or a polymer dielectric material including photoimageable dielectric materials. The dielectric material 3 is typically about 12 to about 55 microns thick and more typically about 18 to about 37 microns thick. Examples of suitable photoimageable dielectric material are polyimides.

The circuit features 4 are then defined in the dielectric material 3 such as by laser ablation. The circuit features are formed through the dielectric layer 3 up to the conductive layer 2 exposing the layer 2. For example, any of the known techniques for laser ablating can be employed. For instance, in the case of polyimides, the film is subjected to UV radiation of 308 nanometer wavelength. A commercially available source for such is the xenon chloride excimer laser.

The xenon chloride excimer laser as is well known, is designed for pulsed operation and, typically 200 mJ pulses/cm$^2$ are available at a repetition rate of about 300/second. This laser can be coupled to appropriate beam shaping and homogenizing optics to provide an apparatus for projecting a coherent beam through a mask. In general, intensities above about 60 mJ/cm$^2$ are employed for the laser ablating. Further details of laser ablating of polyimides can be found for example, in U.S. Pat. No. 4,568,632, disclosure of which is incorporated herein by reference.

The circuit features are typically separated about 0.5 to 3.0 mils. Some circuit features may be as large as 1 inch length by 1 inch width to allow an electronic component such as a silicon chip to reside in the structure.

Figure 3D:
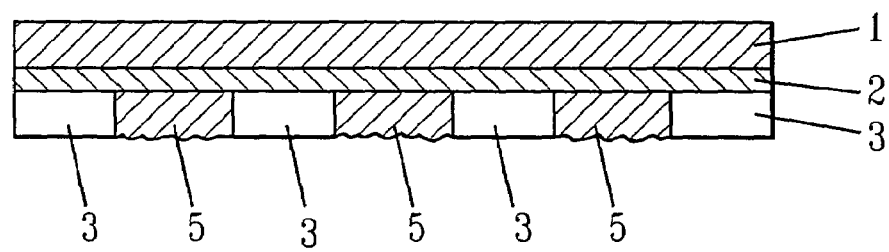

A conductive material 5 such as copper is then selectively plated onto the underlying conductive material 2 in the features defined in the dielectric layer 3 by the laser ablation of the dielectric layer 3 (see FIG. 3d). The underlying conductive material 2 can act as a seed for the plating. The conductive film can be deposited by electroless plating, electroplating, sputter coating or evaporation techniques that are well known in the art. The preferred method of depositing the conductive film is by electroplating.

Figure 3E:
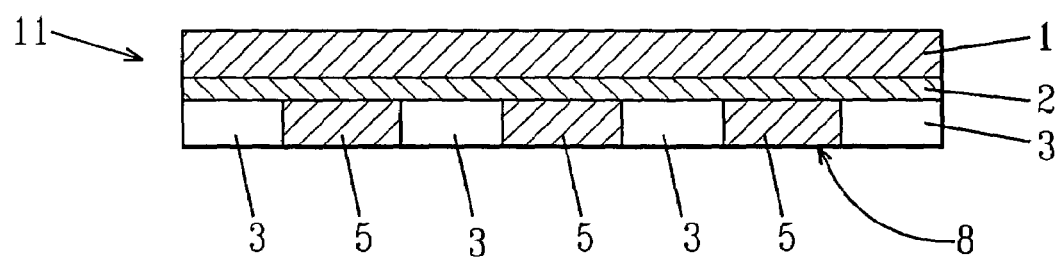

The plated conductive material 5 is then planarized such as employing chemical mechanical polishing to achieve an alternating metal 1 dielectric of high density circuitry 11 having a first flush planar circuitry surface 8 (see FIG. 3e).

Figure 3F:
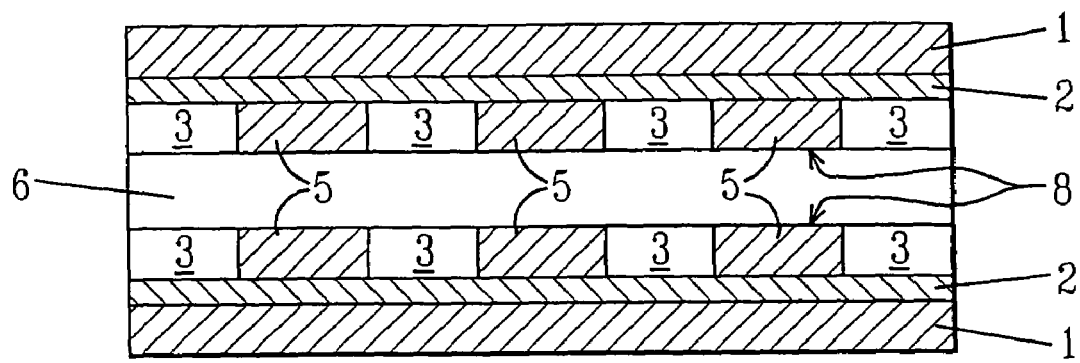

The structure 11 can be employed in single layer or a multi-layered structure by attaching the first flush planar circuitry surface 8 to a stiffening dielectric layer 6 such as pre-preg by lamination or by coating with a film or aqueous resist such as a photo imageable dielectric (PID). Pre-pregs are typically dielectric polymeric materials such as epoxides or polyimides reinforced with woven and non-woven fibers such as fiberglass. The use of PID for layer 6 allows interconnects to subsequent layers of metalization thru either standard photo chemical, laser or mechanical techniques such as drilling. In addition the use of PID for layer 6 allows it to be machined thru laser or photochemical techniques to contain features for the next layer of flush circuitry. Layer 6 also provides mechanical robustness needed for the following processing. See FIG. 3*f* for an example of a multilayer structure.

Figure 3G:
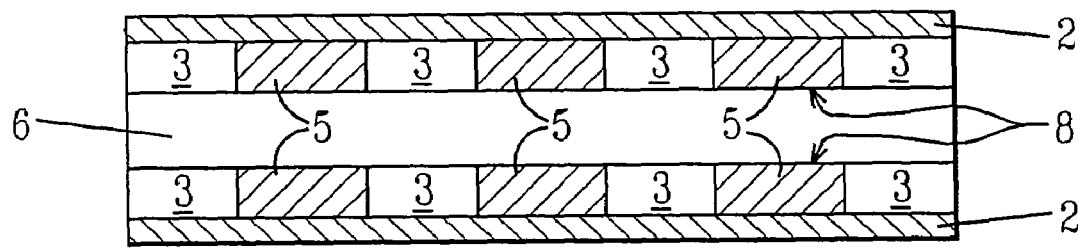

Next the carrier foil 1 can be removed such as by etching in a suitable etchant (see FIG. 3*g*). The layer 2 such as the chromium acts an etch mask to protect the underlying conductive material 5 during the removal of carrier foil 1. The layer 2 is a different material than foil 1 and conductive material 5.

Figure 3H:
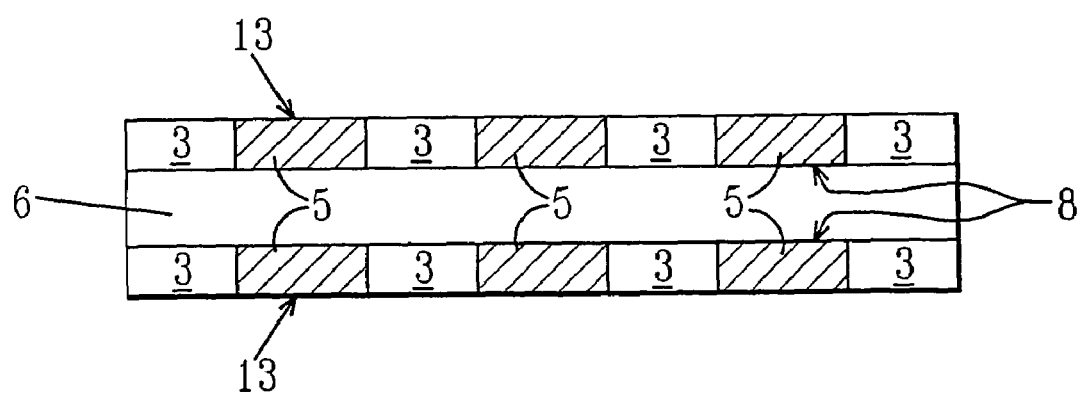

As illustrated in FIG. 3*h*, the conductive material 2 can be removed since it is no longer required. It can be removed by etching in a suitable etchant. The two second flush planar circuitry surfaces 13 now revealed are ideal for subsequent metalization of the circuit lines and features. For example, the planar surface the circuitry is flushly embedded in, allows these circuits lines and features to be gold/nickel-gold plated by standard techniques as well know in the art to even finer features and spacings without the traditional bridging problems. Gold depositions may be done selectively and with different types of gold such as hard or soft to enable optimization of both connectors and gold wire bond.

Moreover, the multiple structure obtained pursuant to the above processing can then be joined together to form a multilayer circuit board.

Figure 4A:
FIGS. 4a–4h are schematic diagrams of the structure in progressive stages of fabrication according to a still further method of the present invention.

FIG. 4*a* illustrates a carrier foil 1 typically a copper foil. The carrier foil 1 can include a top smooth metallized surface and a bottom rough or dendrite surface. The foil is typically about 9 to about 72 microns thick and more typically about 12 to about 18 microns thick. Typically suitable copper foils include 0.5 oz and 1 oz.

Figure 4B:
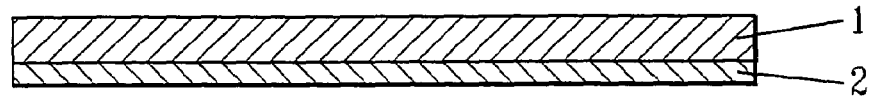

FIG. 4*b* illustrates blanket coating an electrically conductive layer 2 onto the top smooth metallized surface of carrier foil 1. An example of a suitable electrically conductive layer 2 is chromium which can be deposited by sputtering or evaporation. The layer 2 is typically about 500 to about 5000 angstroms thick and more typically about 800 to about 1500 angstroms thick.

Figure 4C:
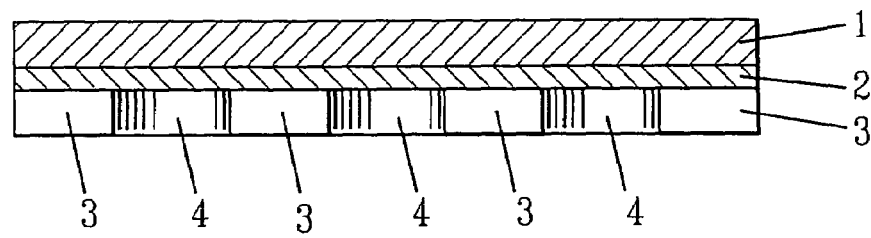

FIG. 4*c* illustrates coating the electrically conductive layer 2 with a dielectric material 3. The dielectric material 3 can be an inorganic dielectric such as silicon dioxide, silicon oxynitride or a polymer dielectric material including photoimageable dielectric materials. The dielectric material 3 is typically about 12 to about 55 microns thick and more typically about 18 to about 37 microns thick. Examples of suitable photoimageable dielectric material are polyimides.

The circuit features 4 are then defined in the dielectric material 3 such as by laser ablation. The circuit features are formed through the dielectric layer 3 up to the conductive layer 2 exposing layer 2. For example, any of the known techniques for laser ablating can be employed. For instance, in the case of polyimides, the film is subjected to UV radiation of 308 nanometer wavelength. A commercially available source for such is the xenon chloride excimer laser.

The xenon chloride excimer laser as is well known, is designed for pulsed operation and, typically 200 mJ pulses/cm$^2$ are available at a repetition rate of about 300/second. This laser can be coupled to appropriate beam shaping and homogenizing optics to provide an apparatus for projecting a coherent beam through a mask. In general, intensities above about 60 mJ/cm$^2$ are employed for the laser ablating. Further details of laser ablating of polyimides can be found for example, in U.S. Pat. No. 4,568,632, disclosure of which is incorporated herein by reference.

The circuit features are typically separated about 0.5 to 3.0 mils. Some circuit features may be as large as 1 inch length by 1 inch width to allow an electronic component such as a silicon chip to reside in the structure.

Figure 4D:
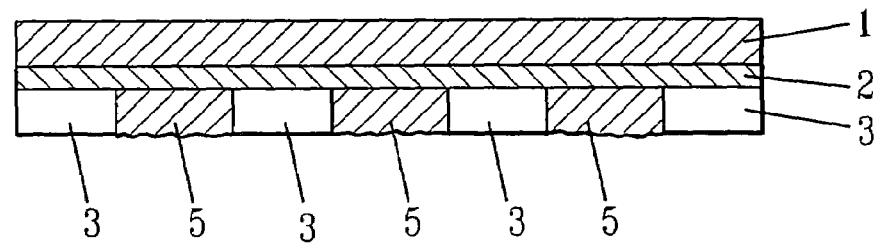

A conductive material 5 such as copper is then selectively plated onto the underlying conductive material 2 in the features defined in the dielectric layer 3 by the laser ablation of the dielectric layer 3, to a thickness not greater than dielectric layer 3 so no bridging between plated features occurs avoiding the need for chemical mechanical polishing to planarize the surface (see FIG. 4*d*). The underlying conductive material 2 can act as a seed for the plating. The conductive film can be deposited by electroless plating, electroplating, sputter coating or evaporation techniques that are well known in the art. The preferred method of depositing the conductive film is by electroplating.

Figure 4E:
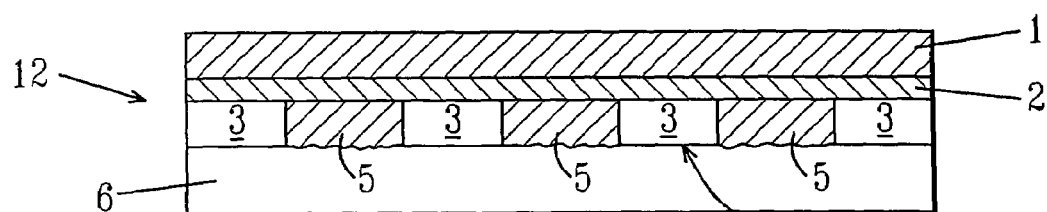
Figure 4F:
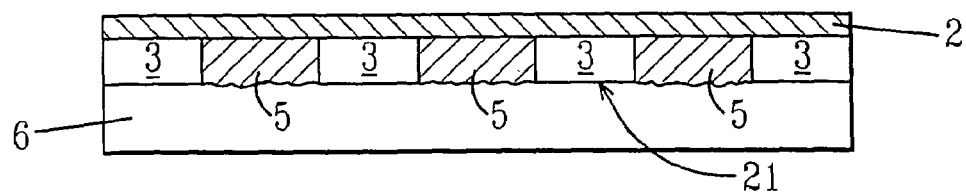

Next, as illustrated in FIG. 4*e*, the underside surface 21 of the structure 12 is attached to a stiffening dielectric layer 6 such as pre-preg by lamination or by coating with a film or aqueous resist such as a photo imageable dielectric (PID). The use of PID for layer 6 allows interconnects to subsequent layers of metalization thru either standard photo chemical, laser or mechanical techniques such as drilling. In addition, use of PID for layer 6 allows it to be machined thru laser or photo chemical techniques to contain features for the next layer of flush circuitry. Layer 6 also provides mechanical robustness needed for the following processing. As illustrated in FIG. 4*f*, the carrier foil 1 can be removed such as by etching in a suitable etchant. The layer 2 such as the chromium acts as an etch mask to protect the underlying conductive material 5 during the removal of carrier foil 1. The layer 2 is a different material than foil 1 and conductive material 5.

Figure 4G:
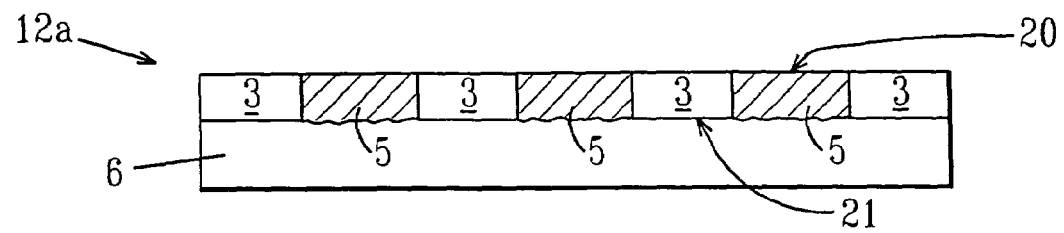

As illustrated in FIG. 4*g*, the conductive material 2 can be removed since it is no longer required. It can be removed by etching in a suitable etchant.

This step reveals an alternating metal/dielectric high density circuitry structure 12 a having flush planar circuitry surface 20 (see FIG. 4*g*). If ISØP is the final structure sought (FIG. 4*g*) the flush planar circuitry surface 20 is ideal for subsequent metalization of the circuit lines and features. For example, the planar surface the circuitry is flushly embedded in, allows these circuit lines and features to be gold/nickel-gold plated by standard techniques as well known in the art to even finer features and spacings without the traditional bridging problems. Gold depositions may be done selectively and with different types of gold such as hard or soft to enable optimization of both connectors and gold wire bond.

Figure 4H:
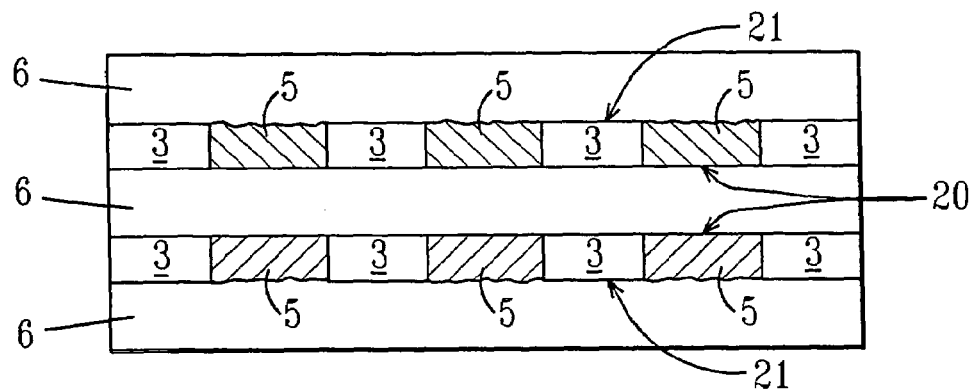

The structure can be employed in single layer or a multi-layered structure by attaching the flush planar circuitry surface 20 to a stiffening dielectric layer 6 such as pre-preg by lamination or by coating with a film or aqueous resist such as a photo imageable dielectric (PID). Pre-pregs are typically dielectric polymeric materials such as epoxides or polyimides reinforced with woven or non-woven fibers such as fiberglass. The use of PID for layers 6 allows interconnects to subsequent layers of metalization thru either standard photo chemical, laser or mechanical techniques such as drilling. In addition the use of PID for layer 6 allows it be machined by laser or photo chemical techniques to contain features for the next layer of flush circuitry. See FIG. 4h for an example of a multilayer structure.

Moreover, the multiple structure obtained pursuant to the above processing can then be joined together to form a multilayer circuit board.

Any of the above methods can be repeated as many times as desired to form a high density circuitry multi-layer structure. Know lamination processes can be used in achieving critical alignment to 0.1 microns.

Figure 2I:
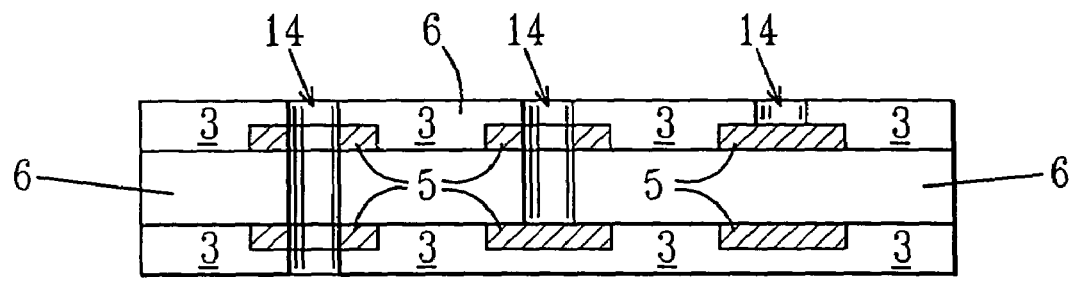
FIGS. 2i–2o are schematic diagrams in progressive stages of layer to layer interconnects and via to via interconnects.
Figure 2J:
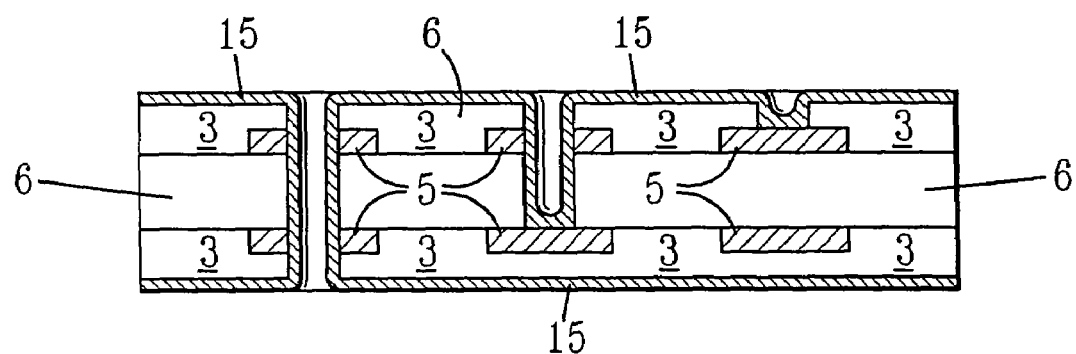
Figure 2K:
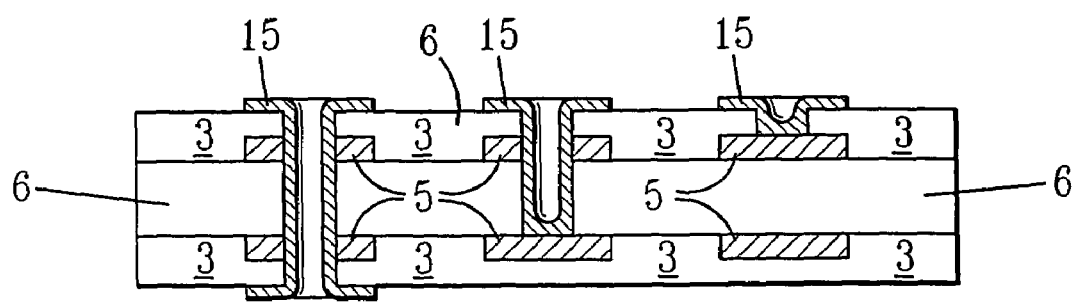

FIGS. 2i, 2j and 2k illustrate one example of several possible interconnect formation sequences leading to a 4 layer electric circuit structure with various levels of interconnects shown. Starting with FIG. 2h as the base structure FIG. 2i illustrates formation of vias 14 thru the structure by any of several existing techniques such as laser, mechanical drill, or photo circuitize of the PID layers 3.

FIG. 2j illustrates blanket seed (not shown) and conductive metallic plate 15 of the structure including the vias.

FIG. 2k illustrates the results of selective substractive etch circuitize process showing plated interconnects.

FIGS. 2l, 2m, 2n and 2o illustrate another example of possible interconnect formation sequences leading to a 4 layer electrical circuit structure with various levels of interconnects shown. This example also shows the completed external surface to be flush planar circuitry.

Figure 2L:
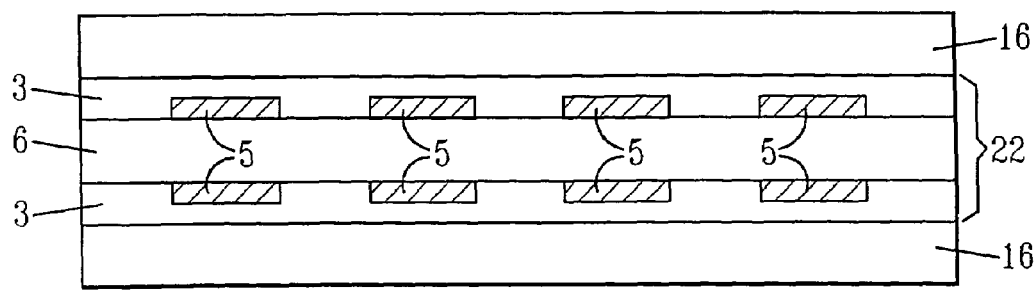

Starting with structure 22 as shown in FIG. 2h as the base structure FIG. 2l illustrates attachment of additional PID layers 16 to form structure 24.

Figure 2M:
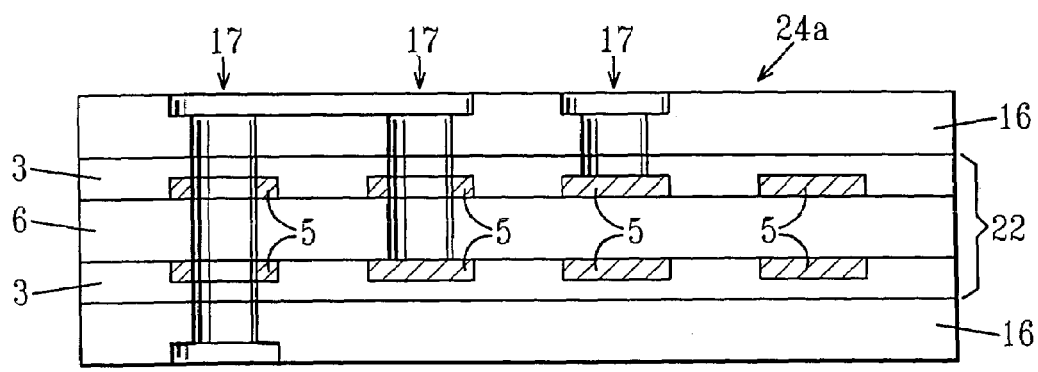

FIG. 2m illustrates formation of vias 17 thru the structure 24 by any of several exiting techniques such as laser, mechanical drill, or photo circuitize of the PID layers 16. FIG. 2m also illustrates formation of via to via interconnect features 23 in the dielectric layer 16 using the techniques previously illustrated in FIGS. 1 thru 4.

Figure 2N:
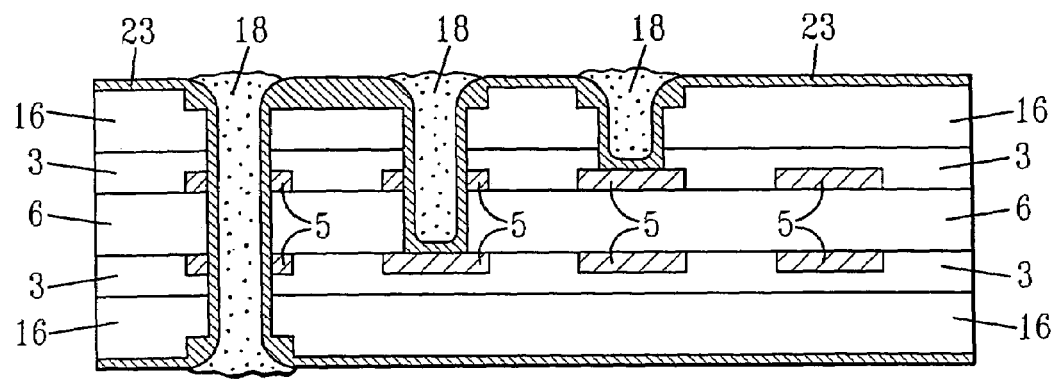

FIG. 2n illustrates results of blanket seed (not shown) and metallic plate followed by filling the barrels of the plated vias with a paste 18 such as soldermask or even a conductive copper paste. The holefill is only needed if one intends to continue adding more circuit layers.

Figure 2O:
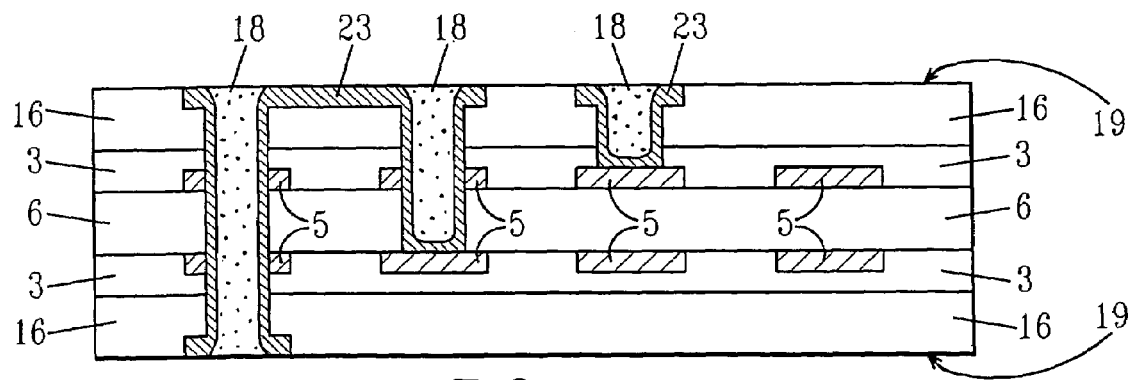

FIG. 2o illustrates results of planarization by chemical mechanical polishing which produces external flush planar circuitry surfaces 19. The surfaces 19 are ideal for subsequent metalization of the circuit lines and features. For example, the planar surface the circuitry is flushly embedded in, allows these circuit lines and features to be gold/nickel-gold plated by standard techniques as well known in the art to even finer features and spacing without the traditional bridging problems.

Figure 5:
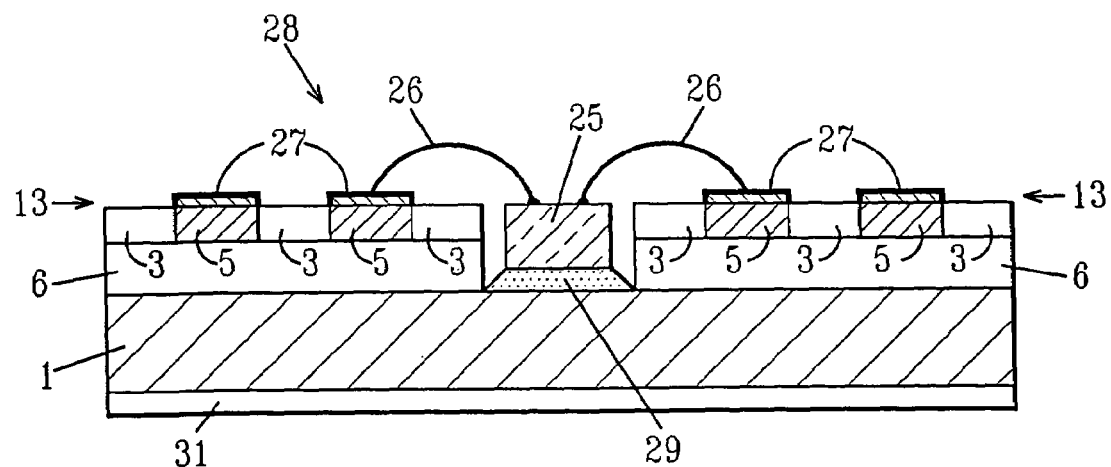
FIG. 5 is a schematic diagram of a completed structure showing typical chip attach and gold wire bond from the chip to the flush planar surface circuitry that has been nickel-gold plated.

FIG. 5 illustrates a structure showing electrical component attach such as a silicon chip 25 and gold wire bond 26 connecting the electrical component to the flush planar surface circuitry 13 which as been coated with nickel/gold finish layer 27. In this structure 28 the component is attached to the underlying metal 1 by means of a thermally and electrically conductive adhesive 29 such as silver filled epoxy which serves to glue the component in place as well as transfer heat from the component to the underlying metal 1. The underlying metal 1 also serves as a stiffening agent and is about 450 microns thick such as a typical 10 ounce copper foil.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of fabricating a structure having multiple layers of embedded substantially flush/coplanar circuitry features, the method comprising:
   providing a stiffening dielectric layer;
   providing first and second structures having embedded, substantially flush, coplanar circuitry features, wherein each said structure is provided by a method comprising:
      providing a carrier foil having a bottom side and an electrically conductive blanket layer on a top side,
      coating the electrically conductive layer with a dielectric material,
      forming circuitry features in said dielectric material,
      plating conductive metal to fill said circuitry features,
      planarizing said conductive metal to provide a planar surface having features of conductive metal surrounded by dielectric material, and
      plating a conductive finish metal layer onto said planar surface; and
   laminating a circuitry side of said first structure to a first side of said stiffening dielectric and laminating a circuitry side of said second structure to a second side of said stiffening dielectric layer.

2. The method of claim 1 wherein the circuitry features are formed through the dielectric layer and up to the conductive layer exposing said conductive layer.

3. The method of claim 1 which further comprises attaching said structure to a substrate or said stiffening dielectric layer.

4. The method of claim 1 wherein the circuitry features are formed through the dielectric layer and up to a first conductive layer exposing said first conductive layer;
   and which further comprises plating a second conductive material selectively onto said first conductive layer;
   attaching the structure to said stiffening dieletric; and
   removing the carrier foil while the conductive layer protects the conductive metal from being removed and then removing the conductive layer to form a smooth surface on one side and a rough surface on another side.

5. The method of claim 1 which further comprises blanket seeding the top surface and circuit features in the dielectric material prior to plating said conductive metal.

6. The method of claim 5 wherein the conductive metal is blanket plated in the seed layer followed by planarizing the conductive metal to provide a planar surface having features of conductive metal surrounded by said dielectric material.

7. The method of claim 1 wherein plating conductive metal is plated only in the circuitry features.

8. The method of claim 7 which further comprises removing the carrier foil while the conductive layer protects the conductive metal from being removed, and then removing the conductive layer.

9. The method of claim 1 which further comprises blanket seeding the top surface and circuit features in the dielectric material prior to plating the conductive metal; planarizing the side of the structure containing said conductive metal to provide a planar surface having features of conductive metal surrounded by dielectric material.

10. The method of claim 9 wherein the circuitry features are formed through the dielectric layer and up to the conductive layer exposing said conductive layer.

11. The method of claim 9, further comprising joining at least two structures having said embedded flush circuitry features together;

and removing the carrier foil while the conductive layer protects the conductive metal from being removed, and then removing the conductive layer to form a smooth surface wiring on one side and a rough surface on another side.

12. The method of claim 1 wherein the circuitry features are formed through the dielectric layer and up to the conductive layer exposing said conductive layer;

and which further comprises plating said conductive metal selectively onto said conductive layer; and planarizing the side of the structure containing metal to provide a planar surface having features of conductive metal surrounded by dielectric material.

13. The method of claim 12, further comprising joining at least two structures having said embedded flush circuitry features together;

and removing the carrier foil while the conductive layer protects the conductive metal from being removed, and then removing the conductive layer to form a smooth surface wiring on one side and a rough surface on another side.

14. The method of claim 1 which comprises removing the carrier foil while the conductive layer protects the conductive metal from being removed, and then removing the conductive layer to form a smooth surface wiring on one side and a rough surface on another side.

15. The method of claim 14, further comprising plating a conductive finish layer of a metal selected from the group consisting of gold, nickel gold, and precious metals onto said smooth surface wiring.

16. The method of claim 14, which further comprises attaching said rough surface to said stiffening dielectric layer.

17. The method of claim 16 which further comprises attaching to a substrate.

\* \* \* \* \*